US007000845B2

(12) United States Patent
Welling et al.

(10) Patent No.: US 7,000,845 B2
(45) Date of Patent: Feb. 21, 2006

(54) THROUGHPLATING OF FLEXIBLE PRINTED BOARDS

(75) Inventors: Ando Welling, Isen (DE); Matthias Bergmann, Vogtareuth (DE); Joachim Hoppe, Munich (DE)

(73) Assignee: Giesecke & Devrient GmbH, Munich (DE)

( * ) Notice: Subject to any disclaimer, the term of this patent is extended or adjusted under 35 U.S.C. 154(b) by 0 days.

(21) Appl. No.: 10/477,139

(22) PCT Filed: May 6, 2002

(86) PCT No.: PCT/EP02/04985

§ 371 (c)(1),
(2), (4) Date: Jun. 8, 2004

(87) PCT Pub. No.: WO02/091811

PCT Pub. Date: Nov. 14, 2002

(65) Prior Publication Data

US 2004/0206829 A1  Oct. 21, 2004

(30) Foreign Application Priority Data

May 9, 2001  (DE) ............... 101 22 414

(51) Int. Cl.
*G06K 19/06* (2006.01)

(52) U.S. Cl. .............. 235/492; 235/485; 361/769; 361/737; 361/720; 216/18; 257/758; 257/700; 438/239; 438/613

(58) Field of Classification Search .......... 235/492, 235/485; 361/769, 737, 720; 216/18; 257/758, 257/700; 430/313; 438/239, 613
See application file for complete search history.

(56) References Cited

U.S. PATENT DOCUMENTS

| 2,353,061 | A |   | 7/1944  | Oldenboom |
| 5,280,409 | A | * | 1/1994  | Selna et al. .................. 361/720 |
| 5,378,314 | A | * | 1/1995  | Schmidt et al. ............... 216/18 |
| 5,719,749 | A | * | 2/1998  | Stopperan .................... 361/769 |
| 5,979,042 | A | * | 11/1999 | Duke ......................... 29/739 |
| 6,049,461 | A | * | 4/2000  | Haghiri-Tehrani et al. .. 361/737 |
| 6,485,892 | B1| * | 11/2002 | Blumberg et al. .......... 430/313 |
| 6,495,911 | B1| * | 12/2002 | Buffet et al. ................ 257/700 |
| 6,503,821 | B1| * | 1/2003  | Farquhar et al. ............ 438/613 |
| 6,533,034 | B1| * | 3/2003  | Barger ...................... 166/241.7 |
| 2001/0011685 | A1 | * | 8/2001 | Fries et al. ................. 235/492 |
| 2003/0151142 | A1 | * | 8/2003 | Ireland ...................... 257/758 |
| 2003/0157765 | A1 | * | 8/2003 | Allman et al. ............. 438/239 |
| 2004/0194305 | A1 | * | 10/2004 | deRochemont et al. ....... 29/832 |
| 2004/0201390 | A1 | * | 10/2004 | Farnworth et al. ......... 324/754 |

FOREIGN PATENT DOCUMENTS

| DE | 2 107 591 A  | 8/1972 |
| DE | 2 241 333 A  | 3/1974 |
| DE | 195 22 338 A | 1/1997 |
| GB | 2 163 007 A  | 3/1986 |
| JP | 01-125892 A  | 5/1989 |
| JP | 05-235499 A  | 9/1993 |

(Continued)

*Primary Examiner*—Karl D. Frech
*Assistant Examiner*—Allyson N Trail
(74) *Attorney, Agent, or Firm*—Rothwell, Figg, Ernst & Manbeck, PC

(57) ABSTRACT

For throughplating flexible circuit boards, two electrically conductive layers located on opposing surfaces are electrically interconnected by cutting through the circuit board using a simple cutting tool for producing a passage. A defined quantity of conductive material is then inserted optionally into the through hole.

4 Claims, 2 Drawing Sheets

FOREIGN PATENT DOCUMENTS

Figure 1A:
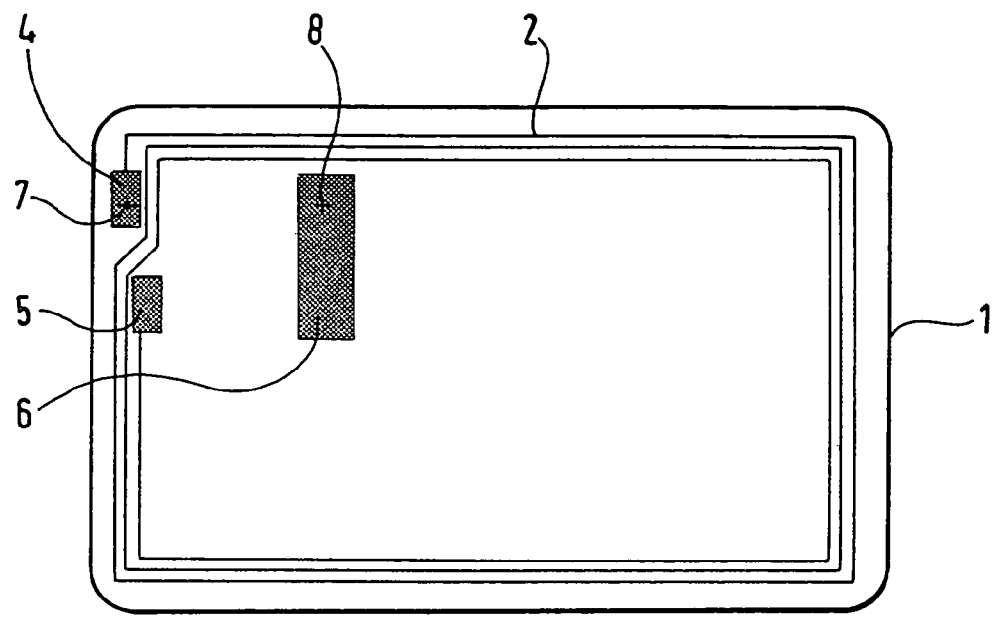

| | | |
|---|---|---|
| JP | 09-263079 A | 10/1997 |
| JP | 2000-216537 A | 8/2000 |

* cited by examiner

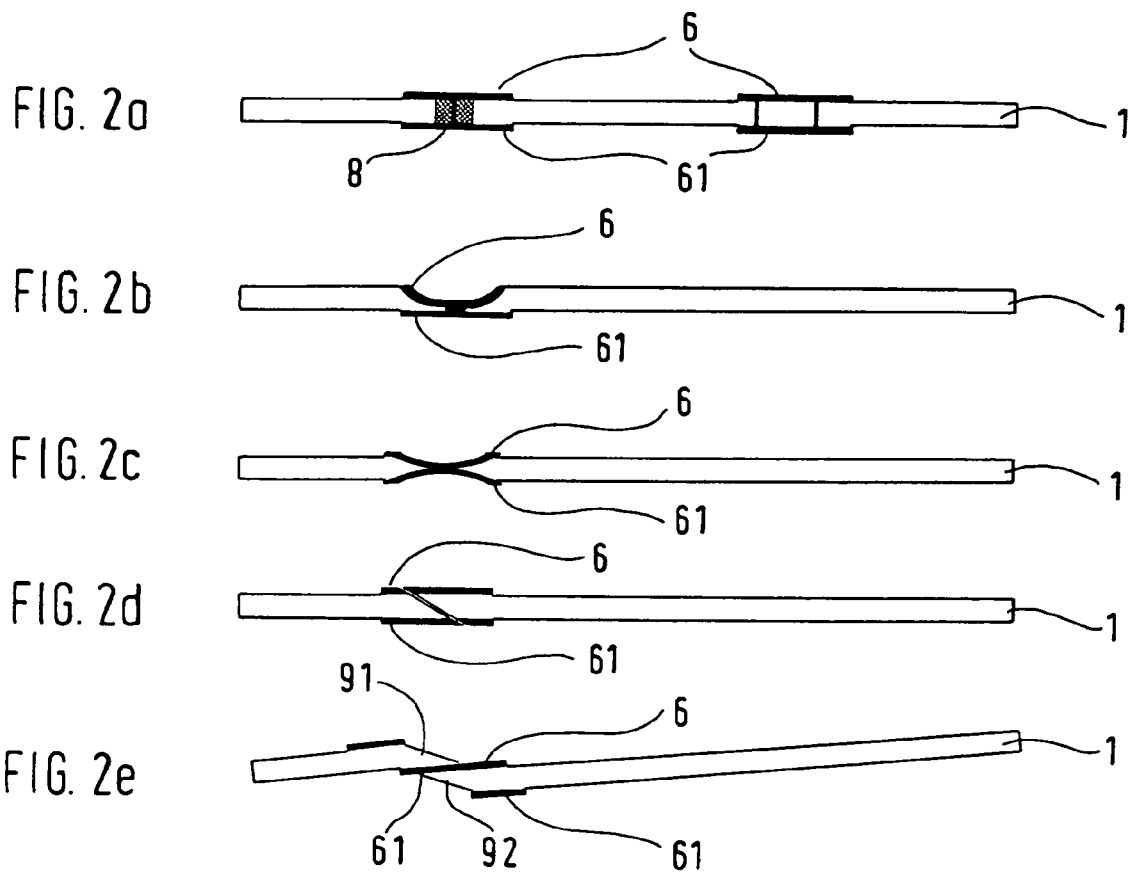

THROUGHPLATING OF FLEXIBLE PRINTED BOARDS

This application is a §371 of PCT Application Serial No. PCT/EP02/04985, filed May 6, 2002.

This invention relates to the throughplating of flexible circuit boards suitable to be mounted in smart cards. In particular the invention relates to a substrate for a card with an integrated circuit (IC card or smart card) having on two opposing surfaces electrically conductive layers that are electrically interconnected through the substrate, and to a corresponding card and a method for producing such a substrate.

Such a substrate or such circuit boards are usually integrated into IC cards (ID cards, credit cards, cash cards, etc.) as card inlays and frequently constitute a separate layer of the card body. On one side of the circuit board there may be for example an integrated circuit formed by the conductive layer with further electronic components, while the conductive layer on the opposite side of the circuit board is formed for example as an antenna coil for contactless data exchange with external devices which is electrically connected with the integrated circuit through the circuit board. This is also referred to as "throughplating" or "plating through" the circuit board.

Throughplating is conventionally effected by punching or drilling a through hole into which a metal sheath is inserted for electrically connecting the two opposing conductive layers. Such throughplatings are elaborate and accordingly expensive.

European laid-open print EP-A 0 884 973 discloses a method for throughplating single- or multilayer circuit boards wherein through openings are first produced in the board that are then printed with conductive paste. By producing a vacuum, the conductive paste is sucked into the contacting holes. To obtain reliable throughplating it is necessary to suck the conductive paste into the through hole in a first vacuum step and suck the conductive paste back in a second vacuum step in order to ensure a uniform distribution of the conductive material.

The problem of the present invention is to simplify the production of throughplated flexible circuit boards.

This problem is solved according to the invention by a substrate for an IC card and a corresponding card as well as an associated production method according to the features of the independent claims. Advantageous embodiments and developments of the invention are stated in claims dependent thereon.

Accordingly, a through hole is neither punched out of the circuit board nor drilled into the circuit board, but a cut-shaped passage produced in the circuit board in simple fashion by a cutting tool, for example by a strip steel cutter, cutting punch, knife, laser or the like. Alternatively, substrate material in the area of the passage can be displaced by pressure and heating so that the opposite conductive layers touch.

The conductive path can already be disposed on the substrate when the passage is produced; alternatively the conductive path is applied to the substrate after the passage is produced.

The throughplating can be formed advantageously by a multiple cut-shaped passage or a cross-shaped passage.

In a further advantageous embodiment of the invention, it is provided that the cut for the cut-shaped passage is selected very short so that only a point-shaped cut is produced. To produce such a cut, needles are preferably used.

If necessary for the throughplating, the passage is then filled with electrically conductive material, it not being required that said passage is filled completely. It is sufficient if an electric connection is produced between the two electrically conductive layers located on the opposing surfaces of the circuit board. The electrically conductive material must thus adjoin both layers.

The electrically conductive material can be any desired material, but it is preferred to use an electrically conductive liquid adhesive which is simply applied to the throughopening and flows into the through opening, possibly also under the influence of capillary forces due to the comparatively small cross section of the through opening.

The electrically conductive material can be advantageously applied on one or both sides by a metering needle or by screen printing or ink-jet printing.

For applying the electroconductive material, in particular conductive liquid adhesive, a metering needle is preferably used which is hollow so that a defined quantity of material can be supplied to the tip of the needle through the needle.

According to a first preferred embodiment, a defined quantity of material is first prepared at the tip of the metering needle ("premetering"), for example as a drop of material suspended at the tip, before the needle is guided to the passage.

According to a second preferred embodiment, the metering needle is first guided to the passage ("postmetering") and then the material injected into the passage through the needle. Premetering and postmetering can also be combined.

For use of silver conductive paste or carbon ink as the conductive material for the throughplating, screen printing is particularly suitable.

When electrically conductive ink is used, the ink-jet printing technique is preferably used. This technique has special advantages for throughplating with cut-shaped passages due to the good flow behavior of conductive ink since it can penetrate them more easily than viscous materials.

The inventive method and thus produced substrates or circuit boards and IC cards have the advantage over conventional throughplatings that both production of the through hole and contacting can be realized very inexpensively with very simple means. No elaborate apparatus or expensive auxiliary materials are needed, and the metering process for inserting electrically conductive material is very easy to control.

If the cut-shaped passage is formed obliquely to the surface of the substrate, the use of further conductive material can be omitted. In this case it suffices to urge the tabs resulting from the oblique cut past each other so that the opposing conductive paths on the substrate touch, i.e. the conductive path on the top of the substrate touches the conductive path on the bottom of the substrate. The mounting in the card, which is usually effected by lamination, stabilizes the connection.

Alternatively, the throughplating can be produced using a tool whose cutting point/edge can be heated. The heated tool is placed with pressure on the conductive path of one side of the substrate. This softens the substrate located under the conductive path so that substrate material is displaced and the conductive path on the first side of the substrate touches the conductive path on the second side of the substrate, thereby creating an electric connection. The passage thus relates in this case only to the substrate material, while the conductive paths are not broken through.

In the following, the invention will be described by way of example with reference to the accompanying drawings, in which:

FIGS. 1a and b show the front and back of an inventive substrate, and

FIGS. 2a to 2e show different embodiments of the throughplatings according to the invention.

FIG. 1a shows the front of substrate 1 suitable to be mounted in a card body. On this side of the substrate, conductive layer 2 in the form of a coil for contactless data and energy exchange with an external device is shown. The coil disposed on this side of substrate 1 has contact surfaces 4 and 5, contact surface 5 being provided for contacting with the module. A further contacting of the coil with the integrated circuit is effected by contact surface 6 which is connected by throughplating 8 with second electrically conductive layer 3 in the form of a second coil on the back of substrate 1 (FIG. 1b).

Figure 1B:
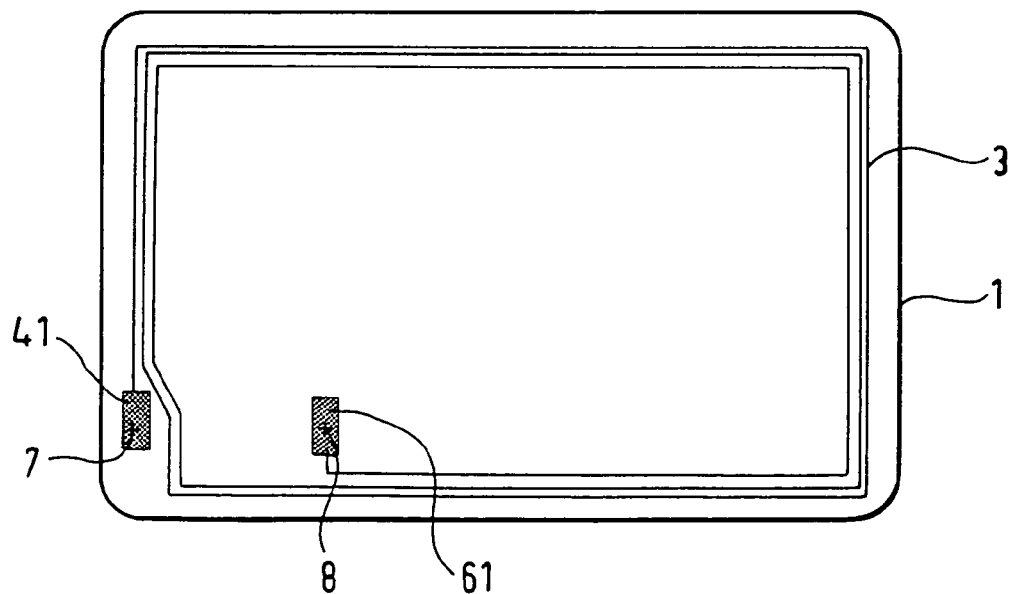

Throughplating is effected in FIG. 1 with cross-shaped passage 8 filled with electrically conductive material. With this passage an electric contact is made with coil 3 on the back of the substrate. Further throughplating 7 of the same kind connects contact surface 4 with coil 3. Contact surfaces 61 and 41 are provided for throughplating, as recognizable from FIG. 1b.

Throughplating 8 is shown in cross section in FIG. 2a, the first cutting line being shown in black and the second cutting line perpendicular thereto being underlaid in gray. FIG. 2a further shows a second kind of passage, the multiple passage, in the present case a double passage.

The passages shown in FIG. 2a are filled with conductive material applied for example with a metering needle on one or both sides. Alternatively, screen printing or ink-jet printing methods can be used depending on the kind of conductive material used.

Penetration of electrically conductive material can be facilitated if the place or area to be plated through is slightly bent simultaneously with or immediately after application to create or to increase an opening.

FIG. 2b shows an embodiment of the invention in which pressure is exerted on one contact surface 6 by a tool whose tip or edge is preferably heated. The heating and pressure urge contact surface 6 onto contact surface 61 and produce the electric connection. Substrate material located in this area becomes at least viscous due to the heat and can thus be readily displaced.

FIG. 2c shows an embodiment in which the pressure and heating are exerted by the tool on both sides.

The tool used is advantageously a soldering iron bit or ultrasonic head. Said tools can be adapted to different requirements without great effort.

FIG. 2d shows an embodiment in which the cut is effected through the substrate and the electroconductive contact surfaces of the coil obliquely to the surface. With this cut, conductive material can be used as in the examples according to FIG. 1a to produce the electric contact between opposite contact surfaces 6 and 61.

Alternatively, in this embodiment of the cut the two tabs 91 and 92 can be urged past each other by pressure (FIG. 2e), so that the opposite contact surfaces touch and thus produce the electric contact. A part of contact surface 6 disposed on the top of the substrate thus touches a part of contact surface 61 disposed on the bottom of the substrate.

To produce the cuts according to FIGS. 2a, d and e it is advantageous to use cutting punches or knives. Goods results can also be achieved using a laser or similar tools.

What is claimed is:

1. A substrate for a card with an integrated circuit, the substrate being coated on two opposing top and bottom surfaces, each surface having an electrically conductive material layer thereon, and each of the electrically conductive layers being electrically interconnected through the substrate, characterized by a cut-shaped passage going through at least one of the substrate or the two electrically conductive layers, wherein the cut-shaped passage extends obliquely to the surfaces, and tabs are produced by the cut-shaped passage, which tabs are urged past each other so that the conductive layer on the top surface of the substrate touches the conductive layer on the bottom surface of the substrate.

2. A card with an integrated circuit comprising a substrate according to claim 1.

3. A card according to claim 2, characterized in that the substrate forms a layer of a body of the card.

4. A method for producing a substrate according to claim 1, comprising the steps of:

providing a substrate with separate electrically conductive layers on opposing top and bottom surfaces of the substrate, cutting through at least one of the substrate or the electrically conductive layers by means of a cutting tool so that a cut-shaped passage remains after removal of the tool, wherein the cut-shaped passage extends obliquely to the surfaces, and tabs are produced by the cut-shaped passage, which tabs are urged past each other so that the conductive layer on the top surface of the substrate touches the conductive layer on the bottom surface of the substrate.

* * * * *